United States Patent
Esch et al.

(10) Patent No.: US 11,616,440 B2
(45) Date of Patent: Mar. 28, 2023

(54) DC/DC VOLTAGE CONVERTER AND METHOD

(71) Applicant: STMicroelectronics (Grenoble 2) SAS, Grenoble (FR)

(72) Inventors: Helene Esch, Seyssinet Pariset (FR); Mathilde Sie, Bernin (FR)

(73) Assignee: STMICROELECTRONICS (GRENOBLE 2) SAS, Grenoble (FR)

(*) Notice: Subject to any disclaimer, the term of this patent is extended or adjusted under 35 U.S.C. 154(b) by 170 days.

(21) Appl. No.: 17/089,102

(22) Filed: Nov. 4, 2020

(65) Prior Publication Data

US 2021/0135574 A1 May 6, 2021

(30) Foreign Application Priority Data

Nov. 5, 2019 (FR) ...................................... 1912390

(51) Int. Cl.
*H02M 3/158* (2006.01)
*H02M 1/088* (2006.01)

(52) U.S. Cl.
CPC ........... *H02M 3/158* (2013.01); *H02M 1/088* (2013.01)

(58) Field of Classification Search
CPC .............................. H02M 3/158; H02M 1/088
See application file for complete search history.

(56) References Cited

U.S. PATENT DOCUMENTS

| 10,256,728 | B1* | 4/2019 | Couleur | .................. H02M 1/08 |
| 2007/0085520 | A1* | 4/2007 | Ho | ....................... H02M 3/1588 323/282 |
| 2011/0291632 | A1* | 12/2011 | Yu | .......................... H02M 3/158 323/283 |
| 2014/0077790 | A1 | 3/2014 | Sohma | |
| 2015/0214827 | A1* | 7/2015 | Yoon | ....................... H02M 1/14 323/286 |
| 2015/0303801 | A1* | 10/2015 | Childs | .................... H02M 3/158 323/271 |
| 2017/0271991 | A1 | 9/2017 | Tsuruyama et al. | |

FOREIGN PATENT DOCUMENTS

EP 0303289 A2 2/1989
JP 2005084013 A 3/2005

* cited by examiner

*Primary Examiner* — Rafael O De Leon Domenech
(74) *Attorney, Agent, or Firm* — Slater Matsil, LLP

(57) ABSTRACT

In an embodiment, a voltage converter includes: a first transistor coupled between an internal node and a first node receiving a supply voltage; a second transistor coupled between the internal node and a second node receiving a reference voltage; an inductance coupled between the internal node and an output node; a first circuit controlling the first and second transistors; and a second circuit configured to detect, when the first and second transistors are in the off state, when the voltage of the internal node is equal to the voltage of the output node, to condition a switching to the on state of the first transistor.

23 Claims, 5 Drawing Sheets

DC/DC VOLTAGE CONVERTER AND METHOD

CROSS-REFERENCE TO RELATED APPLICATIONS

This application claims the benefit of French Patent Application No. 1912390, filed on Nov. 5, 2019, which application is hereby incorporated herein by reference.

TECHNICAL FIELD

The present disclosure relates generally to an electronic system and method, and, in particular embodiments, to a voltage converter.

BACKGROUND

In a switching converter, a supply voltage of the converter is chopped by switching switches so as to implement energy accumulation phases in an inductive element and restoration phases, to a charge connected at the output of the converter, of the energy accumulated in this inductive element.

In a switching converter of the PFM (Pulse Frequency Modulation) type, each operating cycle of the converter comprises an energy accumulation phase in the inductive element followed by an energy restoration phase to the charge connected to the converter. During the energy accumulation phase, the current passing through the inductive element increases. During the energy restoration phase, the current passing through the inductive element decreases. For each operating cycle, it is desirable for the current passing through the inductive element to be null at the beginning of the energy accumulation phase and at the end of the energy restoration phase.

The known switching converters, in particular of the PFM type, have various drawbacks.

SUMMARY

Some embodiments address all or some of the drawbacks of the known switching converters, in particular of the PFM type.

Some embodiments relate to DC/DC voltage converters, of the switching mode power supply type, which convert a direct (DC) supply voltage into a direct (DC) output voltage. Some embodiments relate to DC/DC voltage converters of the step-down type in which the DC output voltage has a value lower than that of the DC supply voltage.

One embodiment provides a voltage converter comprising:
a first MOS transistor connected between an internal node of the converter and a first node configured to receive a supply potential;
a second MOS transistor connected between the internal node of the converter and a second node configured to receive a reference potential; an inductance connected between the internal node and an output node of the converter; a first circuit configured to control the first and second MOS transistors; and a second circuit configured to detect, when the first and second transistors are in the off state, when a potential of the internal node is greater than the supply potential, when the potential of the internal node is less than the reference potential, and when the potential of the internal node is equal to the potential of the output node, the detection that the potential of the internal node is equal to the potential of the output node conditioning a switching control to the on state of the first transistor by the first circuit.

According to one embodiment, the second circuit is configured to supply a first signal switching between a first state of the first signal when the first and second transistors are in the off state and the potential of the internal node is equal to the potential of the output node, and a second state of the first signal when the first and second transistors are in the off state and the potential of the internal node is greater than the supply potential or less than the reference potential.

According to one embodiment, the first circuit is configured to condition the control to the on state of the first transistor based on the first signal.

According to one embodiment, the second circuit comprises a third MOS transistor and a fourth MOS transistor coupled in series between the first and second nodes, the second circuit being configured so that the potential of the internal node determines an off or on state of each of the third and fourth transistors.

According to one embodiment, the second circuit is further configured so that the third and fourth transistors are in the same on or off state when the potential of the internal node is equal to the potential of the output node.

According to one embodiment, the first signal is determined based on the potentials of the drains of the third and fourth transistors.

According to one embodiment, the second circuit comprises a combinatory circuit, one input of which is coupled to the drain of the third transistor, and another input of which is coupled to the drain of the fourth transistor, the combinatory circuit comprising an output configured to supply the first signal.

According to one embodiment, the combinatory circuit comprises an AND gate, one input of which is coupled to the drain of the third transistor, another input of which is coupled to the drain of the fourth transistor by an inverter gate, and another output of which is coupled to the output of the combinatory circuit.

According to one embodiment, the sources of the third and fourth transistors are configured to receive the potential of the internal node, or the gates of the third and fourth transistors are configured to receive the potential of the internal node.

According to one embodiment: the sources of the third and fourth transistors are configured to receive the potential of the internal node; the gates of the third and fourth transistors are configured to receive the potential of the output node; the drain of the third transistor is coupled to the first node; and the drain of the fourth transistor is coupled to the second node.

According to one embodiment, the first and fourth transistors are PMOS transistors, the second and third transistors being NMOS transistors.

According to one embodiment: the gates of the third and fourth transistors are configured to receive the potential of the internal node; the source of the third transistor is coupled to the first node; the source of the fourth transistor is coupled to the second node; and the drain of the third transistor is coupled to the drain of the fourth transistor by at least one resistance.

According to one embodiment, the first and third transistors are PMOS transistors, the second and fourth transistors being NMOS transistors.

According to one embodiment, the converter further comprises a third circuit configured to supply, based on the first signal, a second signal switching between a first state of the second signal and a second state of the second signal, the third circuit being configured to: keep the second signal in the second state of the second signal during a first predetermined duration after a control of a switching of the second transistor to the off state; switch, after the first duration, the second signal to the first state of the second signal after a switching of the first signal to the first state of the first signal; and keep the second signal in the first state of the second signal during a second predetermined duration after the switching of the second signal to the first state of the second signal.

Another embodiment provides an electronic circuit comprising a converter as disclosed.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the typical applications in which a DC/DC converter can be provided have not been described in detail, the disclosed embodiments being compatible with these typical applications.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially," and "in the order of," signify within 10%, and preferably within 5%.

In the description that follows, when reference is made to the voltage of a node, it is considered, unless otherwise indicated, that this involves the voltage between the node and a reference potential, typically the ground. Furthermore, when reference is made to the potential of a node, it is considered that unless otherwise indicated, this potential is referenced relative to the reference potential. The voltage and the potential of a given node will further be designated by a same reference.

Figure 1:
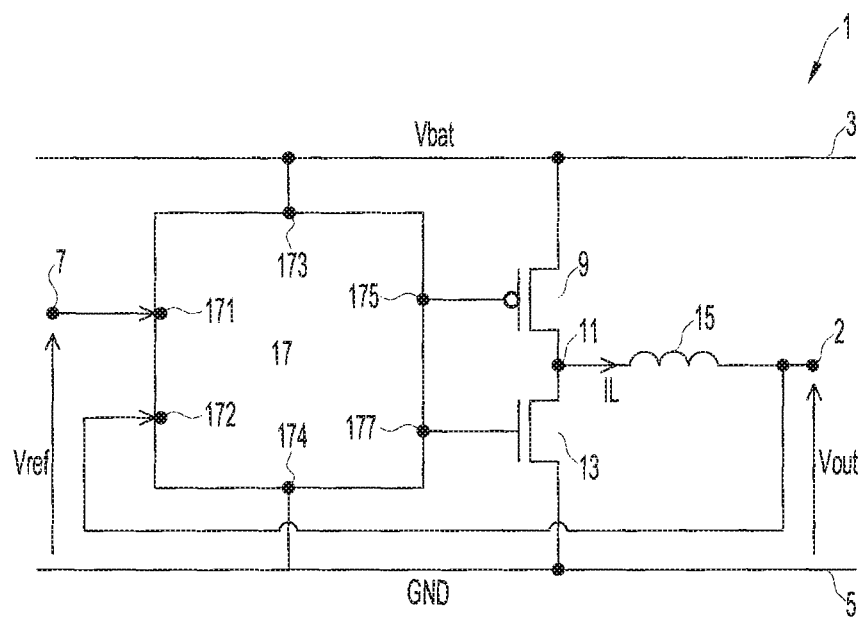
FIG. 1 very schematically shows an exemplary embodiment of a DC/DC voltage converter.

FIG. 1 very schematically shows one example of a voltage converter 1 of the type to which the disclosed embodiments apply. In this example, the converter 1 is a DC/DC converter, of the switching mode power supply type, which converts a direct (DC) supply voltage into a direct (DC) output voltage.

The converter 1 is configured to supply a direct output potential Vout referenced relative to a reference potential, typically the ground GND. The converter comprises an output node 2, on which the potential Vout is available.

The converter 1 is supplied by a direct supply potential Vbat, referenced relative to the reference potential GND, typically the ground. The converter 1 is then connected between a first conductive rail, or node, 3 placed at the potential Vbat, and a second conductive rail, or node, 5 placed at the reference potential GND.

The converter 1 is configured to supply the potential Vout at a value equal to a setpoint value. To that end, the converter 1 receives, on an input node 7, a setpoint direct potential Vref referenced relative to the potential GND, the value of which is representative of the setpoint value of the potential Vout, preferably equal to the setpoint value of the potential Vout.

In this example, the potentials Vout, Vbat and Vref are positive.

In this example, the converter 1 is of the step-down or buck type, that is to say, the setpoint value of the potential Vout is less than the value of the potential Vbat. In other words, the value of the potential Vout is less than that of the potential Vbat.

The converter 1 comprises a first MOS (metal oxide semiconductor) transistor 9, preferably a PMOS transistor (P-channel MOS transistor). The MOS transistor 9 is connected between the rail 3 and an internal node 11. In other words, a first conduction terminal of the transistor 9, for example its source, is connected to the rail 3, a second conduction terminal of the transistor 9, for example its drain, being connected to the node 11.

The converter 1 further comprises a second MOS transistor 13, preferably an NMOS transistor (N-channel MOS transistor). The transistor 13 is connected between the node 11 and the rail 5. In other words, a first conduction terminal of the transistor 13, for example its source, is connected to the rail 5, a second conduction terminal of the transistor 9, for example its drain, being connected to the node 11.

Thus, the transistors 9 and 13 are connected in series between the rails 3 and 5, and are connected to one another at the internal node 11.

The converter 1 comprises an inductive element or inductance 15. The inductance 15 is connected between the node 11 and the node 2.

The converter 1 comprises a control circuit 17. The circuit 17 is configured to implement, or control, the operating cycles of the converter 1, so as to regulate the potential Vout so that its value is equal to the setpoint value Vref.

To that end, the circuit 17 comprises:

a terminal 171 coupled, preferably connected, to the node 7;

a terminal 172 coupled, preferably connected, to the node 2;

a terminal 173 coupled, preferably connected, to the rail 3;

a terminal 174 coupled, preferably connected, to the rail 5;

a terminal 175 coupled, preferably connected, to a control terminal, or gate, of the transistor 9; and a terminal 177 coupled, preferably connected, to a control terminal, or gate, of the transistor 13.

The converter 1 comprises an output capacitance (not shown) connected between the node 2 and the rail 5. As an example, this capacitance is in the order of 2.2 µF to 20 µF, or even more. This output capacitance serves as a filter. In other words, this output capacitance of the converter makes it possible to smooth the current present on the node 2 and to store the energy supplied to the node 2 by the converter.

Although this is not shown here, during operation, a charge is connected between the node 2 and the rail 5 so as to be supplied by the potential Vout. This charge comprises an input capacitance between the node 2 and the rail 5.

In this example, the converter 1 is configured to operate in pulse frequency modulation (discontinuous conduction mode). The circuit 17 is then configured to start an operating cycle of the converter 1 when the value of the potential Vout is below the setpoint value Vref and the two transistors 9 and 13 are in the off state. More particularly, at the beginning of each operating cycle, the circuit 17 is configured to control the placement of the transistor 9 in the on state, the transistor 13 being left in the off state. Energy is then accumulated in the inductance 15, during a first duration Ton that is for example constant for each operating cycle where the transistor 9 is kept in the on state by the circuit 17, a current IL then circulating in the inductance 15. At the end of the duration Ton, the circuit 17 is configured to control the placement of the transistor 9 in the off state and the placement of the transistor 13 in the on state. Energy is then restored by the inductance 15, to the charge connected at the output of the converter, during a second duration Toff that is for example constant for each operating cycle where the transistor 13 is kept in the on state by the circuit 17, the current IL then circulating in the inductance decreasing. At the end of the duration Toff, the circuit 17 is configured to control the placement of the transistor 13 in the off state. Preferably, in some embodiments the duration Ton depends on the potential Vbat, and is constant for a given value of the potential Vbat.

The duration Toff is determined such that the moment where the circuit 17 controls the placement of the transistor 13 in the off state corresponds to the moment where the current IL circulating through the inductance is canceled out. However, in practice, as will be disclosed in more detail in the remainder of the description, this is not always the case, which is problematic.

Figure 2:
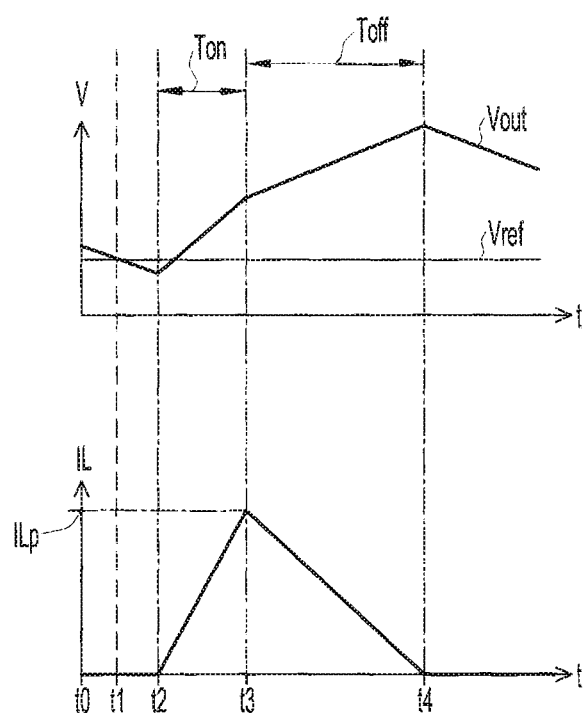
FIG. 2 shows timing diagrams illustrating an exemplary operation of the converter of FIG. 1.

FIG. 2 shows timing diagrams illustrating a desired exemplary operation of the converter 1 of FIG. 1.

The timing diagram at the top of FIG. 2 illustrates the evolution, as a function of time t, of the potential Vout, in volts V, the timing diagram at the bottom of FIG. 2 illustrating the corresponding evolution, as a function of time t, of the current IL passing through the inductance 15.

At a moment to, the transistors 9 and 13 are in the off state, the current IL is null, and the value of the potential Vout is greater than its setpoint value, in this example the value of the potential Vref.

Between the moment to and a later moment t2, the potential Vout decreases, for example due to the fact that the charge connected to the converter 1 is consuming current.

At a moment t1 between the moments to and t2, the potential Vout becomes lower than its setpoint value Vref. This is detected by the circuit 17 of the converter 1, which then controls the placement of the transistor 9 in the on state. The transistor 9 becomes on at the moment t2.

Thus, from the moment t2, the inductance 15 has one terminal connected to the node 2 and one terminal coupled to the rail 3, via the transistor 9. The current IL circulating through the inductance 15 increases.

As a result, from the moment t2, current IL is supplied to the node 2, and the capacitance (not shown in FIG. 1) between the node 2 and the rail 5 is charged. The potential Vout increases and once again becomes higher than its setpoint value Vref.

At a following moment t3, equal to t2+Ton, the circuit 17 controls the placement in the on state of the transistor 13 and the placement in the off state of the transistor 9. At the moment t3, the current in the inductance has a maximal value ILp.

Thus, from the moment t3, the inductance 15 has one terminal connected to the node 2 and one terminal coupled to the rail 5, via the transistor 13. The current IL circulating through the inductance 15 decreases.

Although the current IL decreases from the moment t3, as long as it is not null, the capacitance between the node 2 and the rail 5 continues to be charged and the potential Vout continues to increase if the current drawn by the charge is less than the current IL supplied to the node 2.

At a following moment t4, equal to t3+Toff, the circuit 17 controls the placement in the off state of the transistor 13. It is considered here that the converter 1 is operating as it should, and the current IL is then null at the moment t4. However, in practice, this is not always the case.

From the moment t4, the current IL is null and the potential Vout decreases, similarly to what happened at the moment to.

Although this is not shown here, when the value of the potential Vout returns below its setpoint value Vref at a moment after the moment t4, the circuit 17 implements a new operating cycle as described in relation with the successive moments t2, t3 and t4.

Figure 3A:
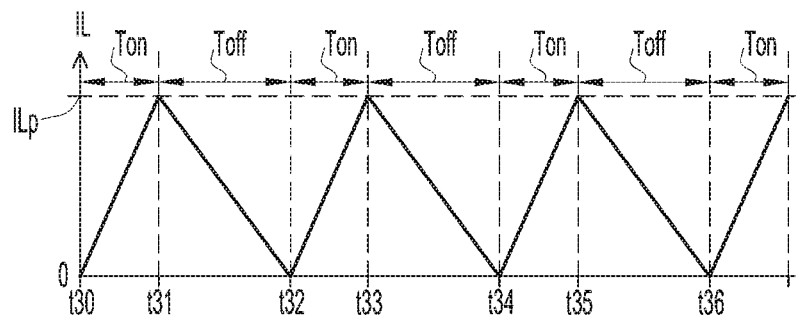
FIGS. 3A and 3B show other timing diagrams illustrating the desired or theoretical operation and the actual or practical operation, respectively, of the converter of FIG. 1.
Figure 3B:
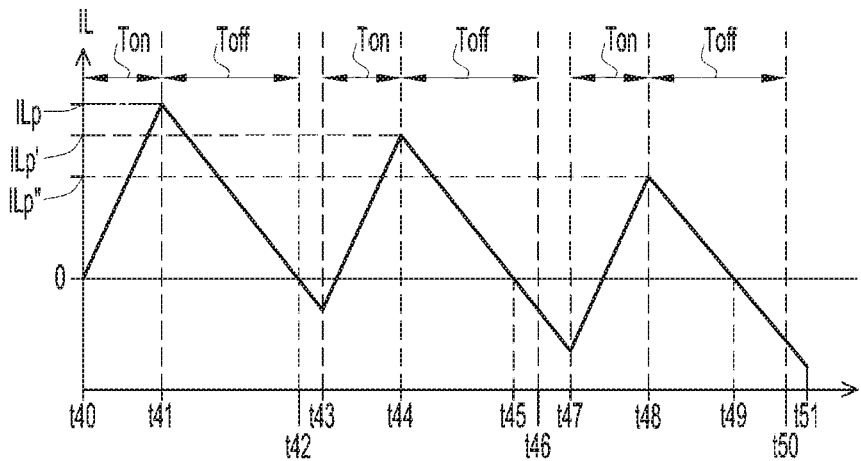

FIGS. 3A and 3B shows other timing diagrams illustrating the converter 1 operation of FIG. 1. More specifically, FIG. 3A shows an ideal or theoretical example of the evolution of the current IL. FIG. 3B shows an example of the actual evolution of the current IL. These two timing diagrams of FIGS. 3A and 3B illustrate an exemplary operation where, for several successive operating cycles, the voltage Vout is less than the voltage Vref at the end of each operating cycle of the converter 1.

At a moment t30, although this is not illustrated in FIG. 3A, the voltage Vout is less than the voltage Vref. An operating cycle begins with the switching to the on state of the transistor 9. As a result, the current IL increases until a following moment t31 equal to t30+Ton.

At the moment t31, the current IL reaches its maximal value ILp. Furthermore, the transistors 9 and 13 are respectively switched to the off state and the on state. As a result, the current decreases until a following moment t32 equal to t31+Toff.

In this ideal exemplary operation, the transistor 13 is switched to the off state at the moment t32, and the current IL is canceled out at this moment t32.

At the moment t32, the voltage Vout being less than the voltage Vref, the transistor 9 is switched to the on state, which marks the beginning of a new operating cycle. The current IL then increases until a following moment t33 equal to t32+Ton.

At the moment t33, the current IL reaches the value ILp. Furthermore, the transistors 9 and 13 are respectively switched to the off state and the on state. As a result, the current decreases until a following moment t34 equal to t33+Toff.

In this ideal exemplary operation, the transistor 13 is switched to the off state at the moment t34, and the current IL is canceled out at the moment t34.

At the moment t34, the voltage Vout being less than the voltage Vref, the transistor 13 is switched to the on state, which marks the beginning of a new operating cycle. The current IL increases until a following moment t35 equal to t34+Ton.

At the moment t35, the current IL reaches the value ILp. Furthermore, the transistors 9 and 13 are respectively switched to the off state and the on state. As a result, the current decreases until a following moment t36 equal to t35+Toff.

In this ideal exemplary operation, the transistor 13 is switched to the off state at the moment t36, and the current IL is canceled out at the moment t36.

At the moment t36, the voltage Vout being less than the voltage Vref, a new operating cycle begins.

In the exemplary theoretical operation illustrated by the timing diagram of FIG. 3A, at the end of each operating cycle, the switching of the transistor 13 to the off state takes place at the moment where the current IL is canceled out. Thus, when an operating cycle is immediately followed by a new operating cycle, in this new operating cycle, the current IL increases from a null value.

The timing diagram of FIG. 3B illustrates a corresponding real operating example of the converter 1. In this real operating example, the practical case is considered where the transistor 13 is not immediately switched to the off state at the end of the duration Toff that has elapsed since its last switching to the on state.

At a moment t40, the voltage Vout being less than the voltage Vref, an operating cycle begins with the switching to the on state of the transistor 9. As a result, the current IL increases until a following moment t41 equal to t40+Ton.

At the moment t41, the current IL reaches its maximal value ILp. Furthermore, the transistors 9 and 13 are respectively switched to the off state and the on state. As a result, the current decreases until a following moment t42 equal to t41+Toff. The current is then canceled out at the moment t42. However, the switching of the transistor 13 to the off state is only effective at a moment t43 after the moment t42. Thus, between the moments t42 and t43, the current IL is negative and decreases. In other words, the current circulates in the inductance 15 of the node 11 toward the node 2 before the moment t42, is canceled out at the moment t42, and circulates in the inductance 15, from the node 2 toward the node 11 after the moment t42.

At the moment t43, the voltage Vout being less than the voltage Vref, the transistor 9 is switched to the on state at the moment t43, which marks the beginning of a new operating cycle. The current IL then increases until a following moment t44 equal to t43+Ton.

At the moment t44, the current IL reaches a value ILp', less than the maximum value ILp due to the fact that the duration Ton is constant in each cycle. Furthermore, the transistors 9 and 13 are respectively switched to the off state and the on state. As a result, the current IL decreases until a following moment t46 equal to t44+Toff, the current IL being canceled out at a moment t45 comprised between the moments t44 and t46. Furthermore, the switching of the transistor 13 to the off state is only effective at a moment t47 after the moment t46. Thus, between the moments t45 and t47, the current IL is negative and decreases to a value lower (or greater in absolute value) than that reached at the moment t43.

At the moment t47, the voltage Vout being less than the voltage Vref, the transistor 9 is switched to the on state at the moment t47, which marks the beginning of a new operating cycle. The current IL then increases until a following moment t48 equal to t47+Ton.

At the moment t48, the current IL reaches a value ILp", below the value ILp'. Furthermore, the transistors 9 and 13 are respectively switched to the off state and the on state. As a result, the current IL decreases until a following moment t50 equal to t48+Toff, the current IL being canceled out at a moment t49 comprised between the moments t48 and t50. Furthermore, the switching of the transistor 13 to the off state is only effective at a moment t51 after the moment t50. Thus, between the moments t49 and t51, the current IL is negative and decreases to a value lower (or greater in absolute value) than that reached at the moment t47.

Because in each operating cycle illustrated by the timing diagram of FIG. 3B, the maximum value reached by the current IL (moments t41, t44 and t48) is increasingly low, the converter 1 does not supply enough energy to the node 2 to regulate the voltage Vout at its value Vref, the voltage Vout for example being increasingly low, which is problematic. Furthermore, in each operating cycle illustrated by the timing diagram of FIG. 3B, the negative value reached by the current IL (moments t43, t47 and t51) is increasingly low (or increasingly high in absolute value), as a result of which the converter 1 draws more and more energy on the node 2, which is not desirable. In theory, the maximum value of the current IL can decrease to infinity, but in practice, the transistor 13 is destroyed before this by negative values of the current IL that the transistor 13 is not able to circulate across its conduction terminals.

In relation with the timing diagram of FIG. 3B, one practical operating example is described in which the switching to the off state of the transistor 13 takes place after the cancellation of the current IL.

In another practical operating example that is not illustrated, in each operating cycle of a plurality of successive cycles implemented immediately one after the other, the transistor 13 is switched to the off state while the current IL is not null and is still positive. In this case, in each of these operating cycles, the current IL increases from an increasingly high value, as a result of which the current IL reaches an increasingly high maximum value, and the operating cycle ends with an increasingly high non-null and positive value of the current IL. This operation is less bothersome than that described in relation with the timing diagram of FIG. 3B since, after several operating cycles, the voltage Vout will have regained its setpoint value Vref. Thus, the following operating cycle will not be implemented immediately, which will leave time for the current IL to be canceled out. However, relative to the case of an ideal operation described in relation with timing diagram of FIG.

3A, such an operation will cause a higher consumption of the converter 1, which is not desirable.

In some embodiments, the inventors propose to make the beginning of an operating cycle subject to the condition that the current IL in the conductance 15 is null. In other words, when, at the end of an operating cycle, the transistor 13 is switched to the off state while the current IL is not null, the inventors propose to delay the beginning of the following operating cycle as long as the current IL has not regained a null value.

More specifically, the inventors have observed that when the transistor 13 is switched to the off state while the transistor 9 is off and the current IL is non-null and positive, the current IL circulates in the intrinsic or body diode of the transistor 13. As a result, the potential of the node 11 is then negative and equal to −Vdiode, with Vdiode the value of the voltage (in absolute value) across the terminals of the body diode of the transistor 13 when the current IL circulates in this body diode. The inventors have also observed that when the transistor 13 is switched to the off state while the transistor 9 is off and the current IL is non-null and negative, the current IL next circulates in the intrinsic or body diode of the transistor 9. As a result, the potential of the node 11 is then positive and equal to Vbat+Vdiode, with Vdiode the value of the voltage (in absolute value) across the terminals of the body diode of the transistor 9 when the current IL circulates in this body diode. Furthermore, the current IL is null when the potential of the node 11 is equal to the potential of the node 2.

In some embodiments, the inventors therefore propose to take advantage of all three states that the potential of the node 11 may assume as a function of the current IL, when the transistors 9 and 13 are in the off state. More specifically, in some embodiments, the inventors propose to detect, among these three states of the potential of the node 11, the state where the potential of the node 11 is equal to the potential of the node 2, which means that the current IL is then null. To that end, in some embodiments, the inventors propose a circuit configured to detect, when the transistors 9 and 13 are in the off state, when the potential of the node 11 is greater than the supply potential Vbat, when the potential of the node 11 is less than the reference potential GND, and when the potential of the node 11 is equal to the potential of the node 2, and to make the beginning of an operating cycle subject to the detection that the potential of the node 11 is equal to the potential of the node 2. According to one embodiment, this circuit is configured to supply a signal switching between a first state, for example a high state, when the transistors 9 and 13, are in the off state and the potential of the node 11 is equal to the potential of the output node, and a second state, for example a low state, when the transistors 9 and 13 are in the off state and the potential of the node 11 is greater than the potential Vbat or less than the potential GND. The switching of the transistor 9 to the on state is then conditioned based on this signal.

Figure 4:
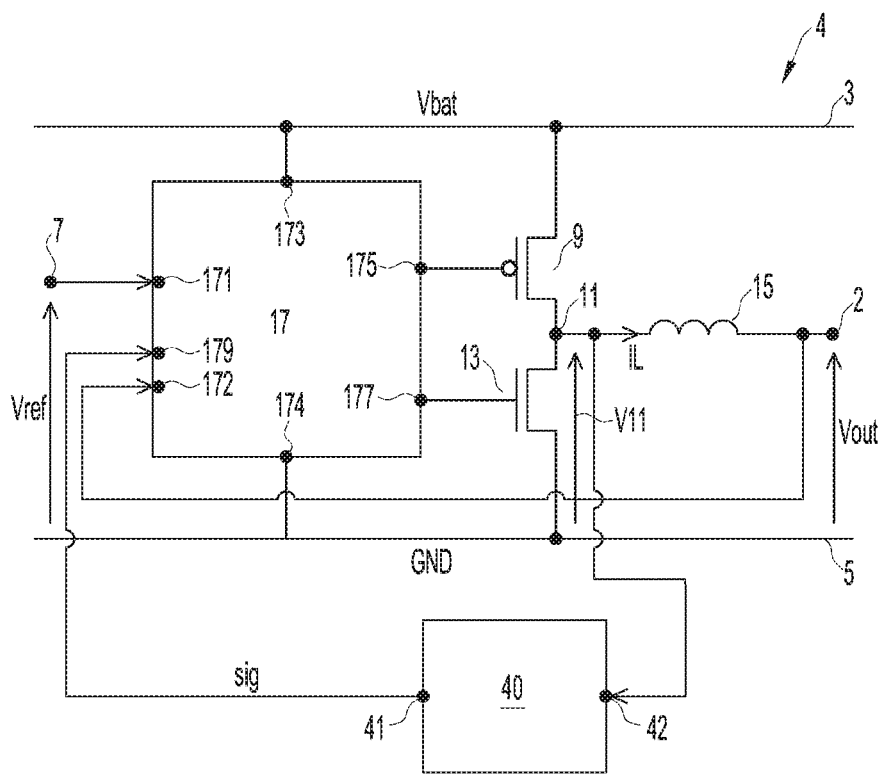
FIG. 4 very schematically shows one embodiment of a DC/DC voltage converter.

FIG. 4 very schematically shows one embodiment of a DC/DC voltage converter 4 comprising such a circuit. The converter 4 comprises many functional or structural elements in common with the converter 1 of FIG. 1 that will not be described again, only the differences between these two converters 1 and 4 being highlighted here.

Relative to the converter 1, the converter 4 comprises an additional circuit 40. The circuit 40 is configured in order to detect, when the transistors 9 and 13 are in the off state, when the potential of the node 11 is greater than the supply potential Vbat, when the potential of the node 11 is below the reference potential GND, and when the potential of the node 11 is equal to the potential of the node 2.

More specifically, the circuit 40 is configured to supply, on one output 41 of the circuit 40, a signal sig switching between a first state, for example a high state, for example equal to the potential Vbat of the rail 3, when the transistors 9 and 13 are in the off state and the circuit 40 detects that the potential of the node 11 is equal to the potential Vout of the node 2, and a second state, for example a low state, for example equal to the potential GND of the rail 5, when the transistors 9 and 13 are in the off state and the circuit 40 detects that the potential of the internal node 11 is equal to Vbat+Vdiode, therefore greater than the potential Vbat of the rail 3, or equal to −Vdiode, therefore less than the potential GND of the rail 5.

The circuit 40 comprises an input 42 coupled, preferably connected, to the node 11. The input 42 is configured so as to receive the potential of the node 11, this potential being referenced V11 in the remainder of the disclosure.

According to one preferred embodiment that is not illustrated, the circuit 40 comprises an additional input coupled, preferably connected, to the node 2. This additional input is then configured to receive the potential Vout and is coupled, preferably connected, to the node 2.

Although this is not shown here, the circuit 40 is preferably supplied by the potential Vbat. The circuit 40 then comprises two supply terminals respectively connected to the rail 3 and the rail 5.

In the embodiment illustrated by FIG. 4, the output signal sig of the circuit 40 is directly supplied to an input 179 of the circuit 17. The circuit 17 is then configured to condition the beginning of each operating cycle of the converter 4 based on the signal sig. In other words, the circuit 17 is then configured to condition the switching of the transistor 9 to the on state at the beginning of each operating cycle based on the state of the signal sig. In still other words, the circuit 17 is configured to determine, based on the signal sig, whether the current IL in the inductance 15 is null, and to control switching to the on state of the transistor 9 only if the current IL is null.

Figure 5:
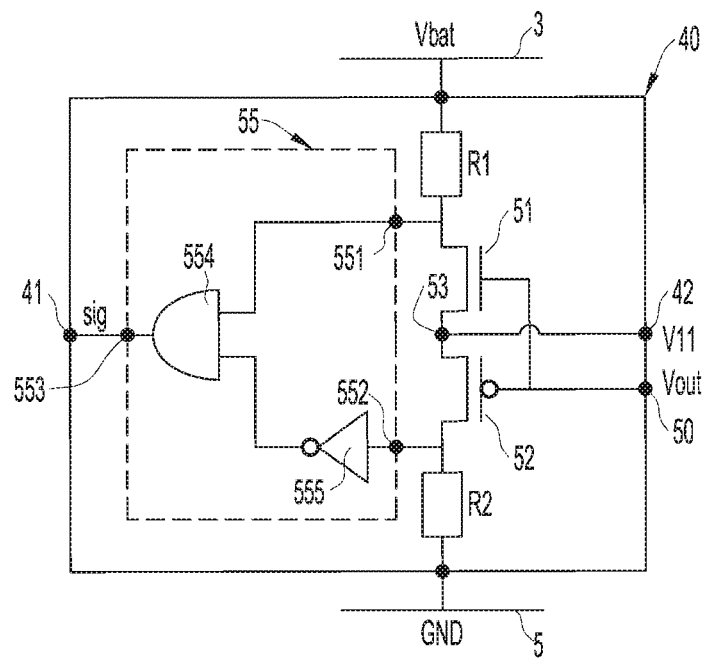
FIG. 5 shows, in the form of a circuit, one embodiment of part of the converter of FIG. 4.

FIG. 5 shows, in the form of a circuit, one embodiment of part of the converter 4 of FIG. 4. More specifically, FIG. 5 shows an embodiment of the circuit 40 of the converter 4.

In this embodiment, the circuit 40 comprises the additional input, here referenced 50, configured to receive the potential Vout of the node 2.

The circuit 40 comprises two MOS transistors 51 and 52 coupled in series between the rails 3 and 5. The circuit 40 is configured so that the potential V11 of the node 11 determines the on or off state of each of the transistors 51 and 52. More specifically, the circuit 40 is configured so that the two transistors 51 and 52 are both in the same state, the off state in this embodiment, when the potential V11 is equal to the potential Vout. Conversely, the circuit 40 is configured so that the transistors 51 and 52 are in different on and off states when the potential V11 is equal to Vbat+Vdiode and when the potential V11 is equal to −Vdiode. The transistors 51 and 52 are said to be in different off and on states if, when one of these transistors 51 and 52 is in the off state, the other of these transistors 51 and 52 is in the on state.

The transistor 51 is connected between the rail 3 and an internal node 53 of the circuit 40, the transistor 52 being connected between the node 53 and the rail 5. More specifically, the transistors 51 and 52 are respectively a NMOS transistor and a PMOS transistor. The transistor 51 comprises a conduction terminal, here its source, coupled, preferably connected, to the node 53, another conduction terminal, here its drain, coupled to the rail 3, here by means of a resistance R1, and a control terminal, or gate, coupled, preferably connected, to the input 50 of the circuit 40. The transistor 52 comprises a conduction terminal, here its source, coupled, preferably connected, to the node 53, another conduction terminal, here its drain, coupled to the rail 5, here by means of a resistance R2, and a control terminal, or gate, coupled, preferably connected, to the input 50 of the circuit 40. In other words, the transistors 51 and 52 have their control terminals connected to one another and configured to receive the potential Vout of the node 2, the sources of the transistors 51 and 52 being coupled, preferably connected, to one another and being configured to receive the potential V11 of the node 11.

The circuit 40 further comprises a combinatory circuit 55, that is to say, a circuit comprising one or several logic gates. The circuit 55 is configured to supply the signal sig, based on the potentials of the drains of the transistors 51 and 52. The circuit 55 comprises a first input 551 connected to the drain of the transistor 51, a second input 552 connected to the drain of the transistor 52 and an output 553 connected to the output 41 of the circuit 40. The output 553 of the circuit 55 is configured to supply the signal sig.

According to one embodiment, the circuit 55 comprises an AND logic gate 554. An input of the gate 554 is coupled, preferably connected, to the input 551 of the circuit 55, therefore to the drain of the transistor 51. Another input of the gate 554 is coupled, by using an inverter gate 555, to the input 52 of the circuit 55, therefore to the drain of the transistor 52. An output of the gate 554 is coupled, preferably connected, to the output 553 of the circuit 50, therefore to the output 41 of the circuit 40.

The operation of the circuit 40 of FIG. 5 is as follows.

When the potential V11 is equal to Vbat+Vdiode, the transistor 51 is off due to the fact that its gate is at the potential Vout less than the potential Vbat+Vdiode of its source. Furthermore, the transistor 52 is on due to the fact that its gate is at the potential Vout less than the potential Vbat+Vdiode of its source. As a result, the drain potential of the transistor 51 is closer to the potential Vbat than the potential GND, and is then considered to be at a high level or state. Furthermore, the drain potential of the transistor 52 is also closer to the potential Vbat than the potential GND, and is then considered to be at a high level or state. Thus, the gate 554 supplies a signal sig at a high level or state.

When the potential V11 is equal to −Vdiode, the transistor 51 is on due to the fact that its gate is at the potential Vout greater than the potential −Vdiode of its source. Furthermore, the transistor 52 is off due to the fact that its gate is at the potential Vout greater than the potential −Vdiode of its source. As a result, the drain potential of the transistor 51 is closer to the potential GND than to the potential Vbat, and is then considered to be at a low level or state. Furthermore, the drain potential of the transistor 52 is closer to the potential GND than to the potential Vbat, and is then considered to be at a low level or state. Thus, the gate 554 supplies a signal sig at a low level or state.

When the potential V11 is equal to the potential Vout of the node 2, the transistors 51 and 52 are both off due to the fact that their gates are at the same potential as their sources. As a result, the drain potential of the transistor 51 is closer to the potential Vbat than the potential GND, and is then considered to be in the high state. Conversely, the drain potential of the transistor 52 is closer to the potential GND than to the potential Vbat, and is then considered to be in the low state. The gate 554 supplies a signal sig at a high level or state.

Thus, when the circuit 40 of FIG. 5 is provided in the converter 4 of FIG. 4, the switching to the on state of the transistor 9 is subject to the condition that the signal sig is in the high state.

One skilled in the art is able to determine the value of the resistances R1 and R2 in order to obtain the operation disclosed hereinabove.

In one embodiment variant that is not shown, the circuit 55 can be implemented with other logic gates, for example a NAND gate in place of the gate 554. In the latter example, the high and low states of the signal sig are then reversed, and the operation of the converter 4 is adapted accordingly.

In still another embodiment variant that is not illustrated, it is provided to disconnect the input 42 of the circuit 40 of FIG. 5 when this circuit 40 is not in use, for example when one or the other of the transistors 9 and 13 of the converter 4 of FIG. 4 is in the on state. As an example, a switch is then provided between the node 11 of the converter 4 and the input 42 of the circuit 40 of FIG. 5. The converter 4 then comprises a circuit configured to place this switch in the open state when one of the transistors 9 and 13 is on, and in the closed state when one of the two transistors 9 and 13 is off. In particular, this circuit can generate the control signal of the switch based on control signals of the transistors 9 and 13 supplied by the circuit 17.

Figure 6:
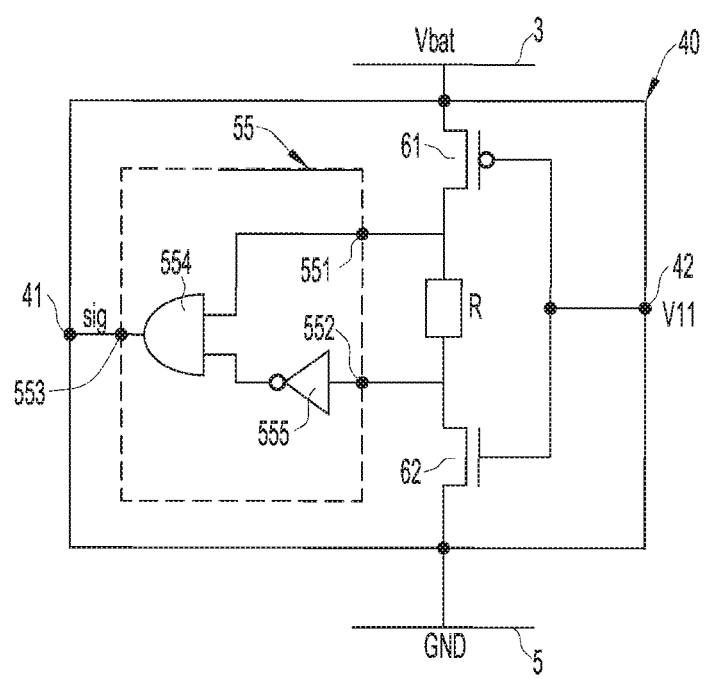
FIG. 6 shows, in the form of a circuit, one embodiment variant of part of the converter of FIG. 4.

FIG. 6 shows, in the form of a circuit, one embodiment variant of part of the converter 4 of FIG. 4. More specifically, FIG. 6 shows an embodiment variant of the circuit 40 of the converter 4.

In this embodiment, the circuit 40 does not comprise an additional input configured to receive the potential Vout of the node 2.

The circuit 40 comprises two MOS transistors 61 and 62 coupled in series between the rails 3 and 5. The circuit 40 is configured so that the potential V11 of the node 11 determines the on or off state of each of the transistors 61 and 62. More specifically, the circuit 40 is configured so that the two transistors 61 and 62 are both in the same state, the on state in this embodiment, when the potential V11 is equal to the potential Vout. Conversely, the circuit 40 is configured so that the transistors 61 and 62 are in different on and off states when the potential V11 is equal to Vbat+Vdiode and when the potential V11 is equal to −Vdiode.

The transistor 61 is connected between the rail 3 and the transistor 62, the transistor 62 being connected between the transistor 61 and the rail 5. In other words, the transistor 61 couples, by its conduction terminals, the rail 3 to a conduction terminal of the transistor 62, the transistor 62 coupling, by its conduction terminals, the rail 5 to a conduction terminal of the transistor 61. More specifically, the transistors 61 and 62 are respectively a PMOS transistor and an NMOS transistor. The transistor 61 comprises a conduction terminal, here its source, coupled, preferably connected, to the rail 3, another conduction terminal, here its drain, coupled to the transistor 62, here by using a resistance R, and a control terminal, or gate, coupled, preferably connected, to the input 42 of the circuit 40. The transistor 62 comprises a conduction terminal, here its source, coupled, preferably connected, to the rail 5, another conduction terminal, here its drain, coupled to the transistor 61, here by means of the resistance R, and a control terminal, or gate, coupled, preferably connected, to the input 42 of the circuit 40. In other words, the transistors 61 and 62 have their control terminals connected to one another and configured to receive the potential V11 of the node 11, the drains of the transistors 61 and 62 being coupled to one another by means of the resistance R. In an embodiment variant that is not illustrated, the resistance R is replaced by several resistances in series between the transistors 61 and 62.

The circuit 40 further comprises the combinatory circuit 55. The circuit 55 here is configured to supply the signal sig, based on the potentials of the drains of the transistors 61 and 62. The first input 551 of the circuit 55 is coupled, for example connected, to the drain of the transistor 61, the second input 552 of the circuit 55 is coupled, for example connected, to the drain of the transistor 62 and the output 553 of the circuit 55 is connected to the output 41 of the circuit 40.

The operation of the circuit 40 of FIG. 6 is as follows.

When the potential V11 is equal to Vbat+Vdiode, the transistor 61 is off due to the fact that its gate is at the potential V11 greater than the potential Vbat of its source. Furthermore, the transistor 62 is on due to the fact that its gate is at the potential V11 greater than the potential GND of its source. As a result, the drain potential of the transistor 61 is closer to the potential GND than to the potential Vbat, and is then considered to be in the low state. Furthermore, the drain potential of the transistor 62 is also closer to the potential GND than to the potential Vbat due to the fact that the transistor 62 is on, and is then considered to be in the low state. Thus, the gate 554 supplies a signal sig in the low state.

When the potential V11 is equal to −Vdiode, the transistor 61 is on due to the fact that its gate is at the potential −Vdiode less than the potential Vbat of its source. Furthermore, the transistor 62 is off due to the fact that its gate is at the potential −Vdiode less than the potential GND of its source. As a result, the drain potential of the transistor 61 is closer to the potential Vbat than the potential GND due to the fact that the transistor 61 is on, and is then considered to be in the high state. Furthermore, the drain potential of the transistor 62 is closer to the potential Vbat than to the potential GND, and is then considered to be in the high state. Thus, the gate 554 supplies a signal sig in the low state.

When the potential V11 is equal to the potential Vout of the node 2, the transistors 61 and 62 are both on. In particular, the transistor 61 is on due to the fact that its gate is at the potential Vout lower than the potential Vbat of its source, and the transistor 62 is on due to the fact that its gate is at the potential Vout greater than the potential GND of its source. As a result, the drain potential of the transistor 61 is closer to the potential Vbat than the potential GND, and is then considered to be in the high state. Conversely, the drain potential of the transistor 62 is closer to the potential GND than to the potential Vbat, and is then considered to be in the low state. The gate 554 therefore supplies a signal sig in the high state.

Thus, when the circuit 40 of FIG. 6 is provided in the converter 4 of FIG. 4, the switching to the on state of the transistor 9 is subject to the condition that the signal sig is in the high state.

One skilled in the art is able to determine the value of the resistance R or resistances in series coupling the transistors 61 and 62 to one another in order to obtain the operation disclosed hereinabove.

In one embodiment variant that is not shown, the circuit 55 can be implemented with other logic gates, for example a NAND gate in place of the gate 554. In the latter example, the high and low states of the signal sig are then reversed, and the operation of the converter 4 is adapted accordingly.

In still another embodiment variant that is not illustrated, it is provided to deactivate the circuit 40 of FIG. 6 when this circuit 40 is not in use, for example when one or the other of the transistors 9 and 13 of the converter 4 of FIG. 4 is in the on state. As an example, one switch is then provided between the drain of the transistor 61 and the resistance R, and another switch is provided between the drain of the transistor 62 and the resistance R. The converter 4 then comprises a circuit configured to place these switches in the open state when one of the transistors 9 and 13 is on, and in the closed state when one of the two transistors 9 and 13 is off. In particular, this circuit can generate the control signals of the switches based on control signals of the transistors 9 and 13 supplied by the circuit 17.

Figure 7:
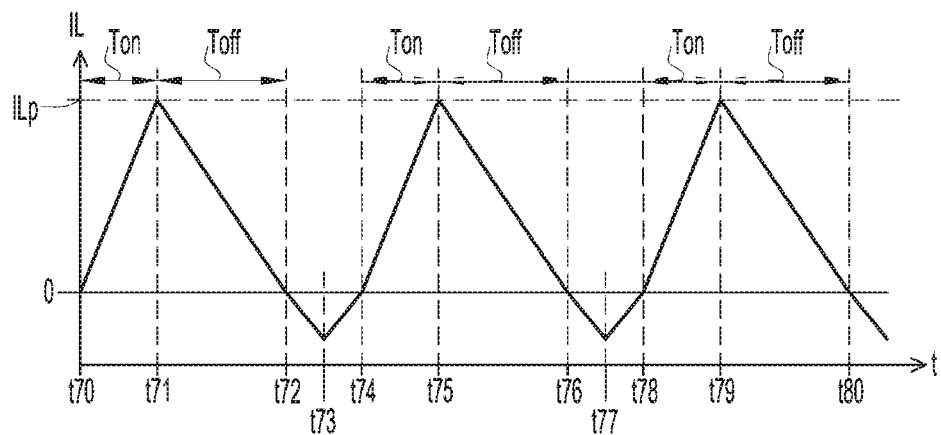
FIG. 7 shows a timing diagram illustrating the operation of the converter of FIG. 4.

FIG. 7 shows a timing diagram illustrating the operation of the converter of FIG. 4. More specifically, the timing diagram of FIG. 7 illustrates the case where, for several successive operating cycles, the voltage Vout is less than the voltage Vref at the end of each operating cycle of the converter 4. An operating example is further considered in which the transistor 13 is switched to the off state while the current IL is negative.

At a moment t70, although this is not illustrated in FIG. 7, the voltage Vout is less than Vref and the circuit 17 determines based on the signal sig that the current IL is null. An operating cycle then begins with the switching to the on state of the transistor 9. As a result, the current IL increases until a following moment t71 equal to t70+Ton.

At the moment t71, the current IL reaches its maximal value ILp. Furthermore, the transistors 9 and 13 are respectively switched to the off state and the on state by the circuit 17. As a result, the current decreases until a following moment t72 equal to t71+Toff. The current is then canceled out at the moment t72. However, the switching of the transistor 13 to the off state is only effective at a moment t73 after the moment t72. Thus, between the moments t72 and t73, the current IL is negative and decreases.

At the moment t73, the voltage Vout is less than the voltage Vref. However, the circuit 17 determines, based on the signal sig, that the current IL is not null. Thus, the circuit 17 does not switch the transistor 9 to the on state at the moment t73. The current IL, which then circulates through the body diode of the transistor 13, increases gradually until being null at a moment t74 after the moment t73. At the moment t74, the circuit 17 determines, based on the signal sig, that the current IL is null, and, since the voltage Vout is less than the voltage Vref, the circuit 17 switches the transistor 9 to the on state, which marks the beginning of a new operating cycle. The current IL then increases until the following moment t75 equal to t74+Ton.

At the moment t75, the current IL reaches the value ILp. Furthermore, the transistors 9 and 13 are respectively switched to the off state and the on state. As a result, the current IL decreases until a following moment t76 equal to t75+Toff. The switching of the transistor 13 to the off state is only effective at a moment t77 after the moment t76. Thus, between the moments t76 and t77, the current IL is negative and decreases.

At the moment t77, the voltage Vout is less than the voltage Vref. However, the circuit 17 determines, based on the signal sig, that the current IL is not null. Thus, the circuit 17 does not switch the transistor 9 to the on state at the moment t77. The current IL, which then circulates through the body diode of the transistor 13, increases gradually until being null at a moment t78 after the moment t77. At the moment t78, the circuit 17 determines, based on the signal sig, that the current IL is null, and, since the voltage Vout is less than the voltage Vref, the circuit 17 switches the transistor 9 to the on state, which marks the beginning of a new operating cycle. The current IL then increases until the following moment t79 equal to t78+Ton.

At the moment t79, the current IL reaches the value ILp. Furthermore, the transistors 9 and 13 are respectively switched to the off state and the on state. As a result, the current IL decreases until a following moment t80 equal to t79+Toff.

Relative to what was described in relation with the timing diagram of FIG. 3B, although the switching to the off state of the transistor 13 occurs while the current IL is negative, the circuit 17 is able to delay the implementation of a new operating cycle (switching of the transistor 9 to the on state) until the current IL has a null value, owing to the circuit 40 and the signal sig that it supplies. Thus, in each operating cycle, the current IL reaches a same maximum value ILp, and the regulating of the voltage Vout to its setpoint value is preserved.

Although the timing diagram of FIG. 7 illustrates the operation of the converter 4 in the case where the switching of the transistor 13 to the off state occurs while the current IL is negative, the circuit 40 also has advantages in the case where the transistor 13 is switched to the off state while the current IL is still positive, for example because the duration Toff is too short relative to the duration Ton.

For example, when the transistor 13 switches to the off state while the current IL is positive and the voltage Vout is below the voltage Vref, the circuit 17 determines, based on the signal sig, that the current IL is not null. The circuit 17 therefore does not switch the transistor 9 to the on state. The current IL, which then circulates in the body diode of the transistor 9, next decreases until it is canceled out. The circuit 17 determines, based on the signal sig, that the current IL is null, and, if the voltage Vout is still below the voltage Vref, the circuit 17 controls the beginning of a new operating cycle by switching the transistor 9 to the on state. In such an operating state, like for what has been described in relation with FIG. 7, in each operating cycle, the current IL reaches a same maximum value ILp, and the regulating of the voltage Vout to its setpoint value is preserved.

Figure 8:
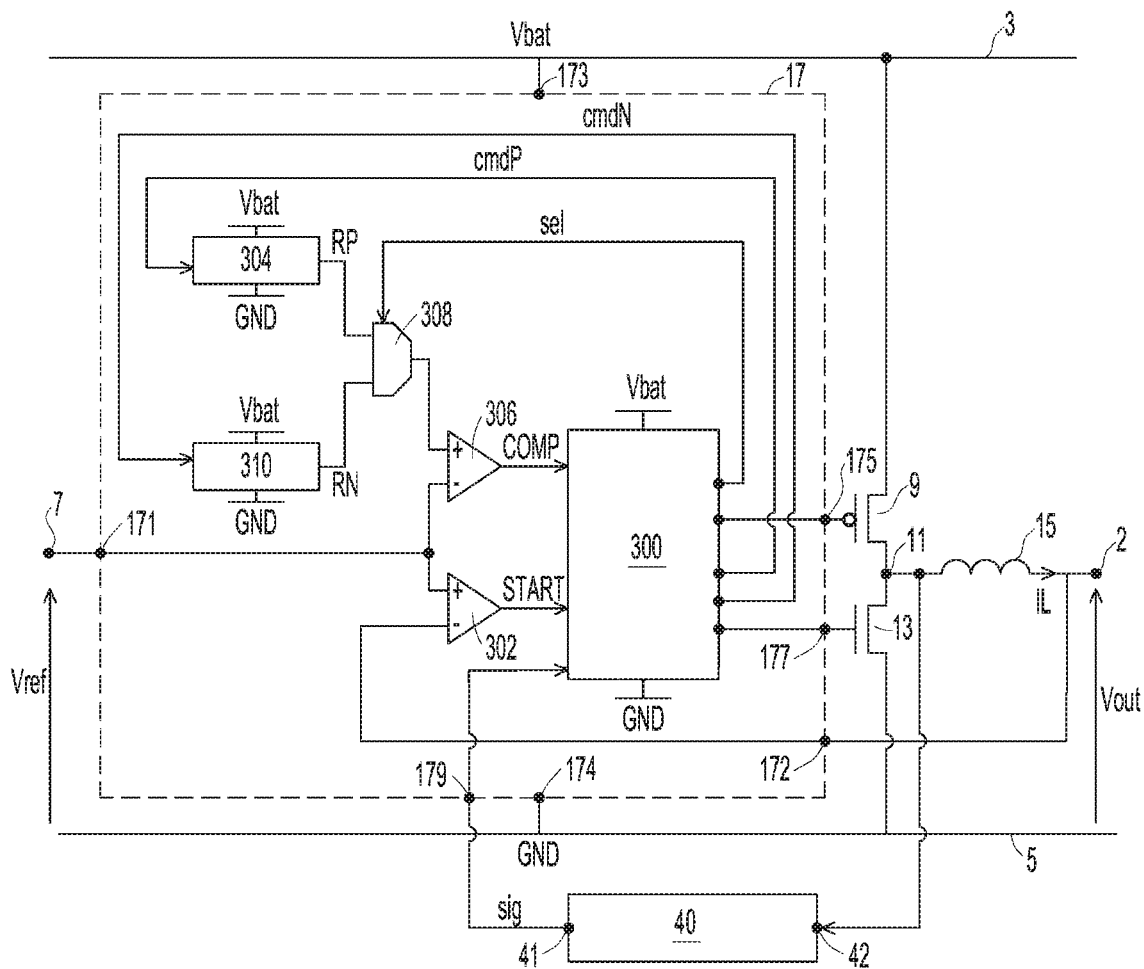
FIG. 8 shows a more detailed embodiment of the converter of FIG. 4.

FIG. 8 shows a more detailed embodiment of the converter of FIG. 4. Only the details not illustrated in FIG. 4 are highlighted here, these details relating to the circuit 17 of the converter 4, delimited by a box in dotted lines in FIG. 8.

The circuit 17 comprises a finite state machine 300. The finite state machine 300 may be implemented, e.g., using custom combinatorial logic coupled to a memory. Other implementations, such as using, e.g., a programmable generic controller, are also possible.

The finite state machine 300 is configured to supply the control signals of the transistors 9 and 13 to the respective terminals 175 and 177 so as to carry out the operation disclosed in relation with FIGS. 4 to 7. In order to determine the control signals of the transistors 9 and 13, the finite state machine 300 receives several signals. As an example, the finite state machine 300 is implemented by a circuit. The circuit 300 is supplied by the potential Vbat, and is connected between the rails 3 and 5, these connections not being described in detail in FIG. 8 so as not to overload the figure.

The circuit 17 comprises a comparator 302 configured to supply, on its output, a signal START representative of the comparison of the value of the potential Vout to its setpoint value. The output of the comparator 302 is coupled, for example connected, to the circuit 300. The signal START is in a first state, for example a high state, when the value of the potential Vout is below its setpoint value, and in a second state, for example a low state, when the value of the potential Vout is above its setpoint value. The comparator 302 comprises a first input, for example an inverter input (−), configured to receive a potential whose value is representative of the value of the potential Vout, and a second input, for example a non-inverter input (+), configured to receive a potential whose value is representative of the setpoint value of the potential Vout.

In this example where the value of the potential Vref is equal to the setpoint value of the potential Vout, the comparator 302 is configured to compare the potential Vref to the potential Vout, the first input of the comparator 302 being connected to the node 2, and the second input of the comparator 302 being connected to the terminal 171 of the circuit 17.

In this embodiment, the duration Ton is determined by comparing a potential ramp RP to the potential Vref or to the potential Vout, the latter being able to be considered as being equal to the potential Vref. Thus, the circuit 17 comprises a ramp generator 304 configured to supply the potential ramp RP and a comparator 306 configured to compare the ramp RP to the potential Vref or Vout, in this example to the potential Vref. The potential RP is referenced at the reference potential GND.

The generator 304 is supplied by the potential Vbat, and is connected between the rails 3 and 5, these connections not being shown in detail in FIG. 8 so as not to overload the figure.

The generator 304 is controlled by the circuit 300, by using a signal cmdP. More specifically, when the START signal is in its first state indicating that the value of the potential VOUT is less than its setpoint value, if the two transistors 9 and 11 are in the off state and if the circuit 300 determines based on the signal sig that it receives that the current IL is null, the circuit 300 controls the placement in the on state of the transistor 9, and, at the same time, the start up, or start, of a potential ramp RP via the signal cmdP. As an example, the signal cmdP is determined based on the control signal supplied by the circuit 300 to the transistor 9, or is identical to the control signal supplied by the circuit 300 to the transistor 9.

According to one embodiment, each potential ramp RP is an increasing ramp from the reference potential GND.

The ramp RP is transmitted to a first input, for example a non-inverter input (+), of the comparator 306, the second input, for example in the inverter input (−), of the comparator 306 receiving the potential Vref, and the output of the comparator 306 supplying a signal COMP to the circuit 300.

According to the preferred embodiment illustrated by FIG. 8, the potential ramp RP is transmitted to the comparator 306 by using a selection circuit 308 comprising two inputs, an output and a control terminal. The control terminal of the circuit 308 receives a signal sel from the circuit 300. As a function of the state of the signal sel, the circuit 308 transmits, on its output, the signal present on one or the other of its inputs.

More specifically, at the moment where the circuit 300 controls the placement in the on state of the transistor 9 and the start of a potential ramp RP, the circuit 300 places the signal sel in a first state such that the comparator 306 receives the potential ramp RP.

Thus, as long as the signal sel is kept in its first state, the signal COMP is in a first state, for example the low state, while the potential RP is below the potential Vref, and switches to a second state, for example the high state, once the potential RP becomes greater than the potential Vref.

The switching of the signal COMP from its first state to its second state marks the end of the duration Ton. The circuit 300 then controls the placement of the transistor 9 in the off state and the placement of the transistor 13 in the on state. Preferably, the circuit 300 simultaneously controls the end of the potential ramp RP, via the signal cmdP.

In this embodiment, the duration Toff is determined by comparing a potential ramp RN to the potential Vref or to the potential Vout, and more specifically in this example to the potential Vref. Thus, the circuit 17 comprises a ramp generator 310 configured to supply the potential ramp RN.

The generator 310 is supplied by the potential Vbat, and is connected between the rails 3 and 5, these connections not being shown in detail in FIG. 8 so as not to overload the figure. The generator 310 is controlled by the circuit 300, by means of a signal cmdN.

More specifically, at the end of the duration Ton, when the circuit 300 controls the placement of the transistor 9 in the off state and the placement of the transistor 13 in the on state, the circuit 300 also controls the starting of a potential ramp RN via the signal cmdN. As an example, the signal cmdN is determined based on the control signal supplied by the circuit 300 to the transistor 13, or is identical to the control signal supplied by the circuit 300 to the transistor 13.

According to one embodiment, each potential ramp RN is a decreasing ramp from the supply potential Vbat.

According to the embodiment illustrated by FIG. 8, the comparison of the ramp RN to the potential Vref is implemented by the comparator 306. The ramp RN is then transmitted to the second input of the circuit 308. Furthermore, the circuit 300 is configured to switch the signal sel to its second state, at the same time that it controls the placement in the off state of the transistor 9 and the placement in the on state of the transistor 13, such that the ramp RN is transmitted to the comparator 306.

Thus, in embodiments where each ramp RN is decreasing from the potential Vbat, as long as the signal sel is kept in its second state, the signal COMP is in its second state, for example the high state, while the potential RN is greater than the potential Vref, and switches to its first state, for example the low state RN, once the potential becomes lower than the potential Vref.

The switching of the signal COMP from its second state to its first state marks the end of the duration Toff. The circuit 300 then controls the placement of the transistor 13 in the off state. Preferably, the circuit 300 simultaneously controls the end of the potential ramp RN, via the signal cmdN.

In an embodiment variant that is not illustrated, the comparison of the potential ramp RP to the potential Vref is carried out by the comparator 306, and the comparison of the potential ramp RN to the potential Vref is carried out using an additional comparator provided in the circuit 17. This additional comparator then receives, on a first input, for example a non-inverter input (+), the potential ramp RN, and on a second input, for example an inverter input (−), the potential Vref, the output of the additional comparator supplying, to the circuit 300, a representative comparison signal of the potential ramp RN to the potential Vref. In this variant, the circuit 308 is omitted and the circuit 300 does not generate the signal sel. One skilled in the art is able to adapt the disclosure provided above of the converter 4 of FIG. 8 to this embodiment variant.

In another embodiment variant that is not illustrated, the ramp RP is a potential ramp decreasing from the potential Vbat and/or the potential ramp RN is a potential ramp increasing from the potential GND. One skilled in the art is able to adapt the converter 4 to this case.

Furthermore, although an exemplary embodiment has been disclosed in which the ramps RP and RN are compared to the potential Vref, one skilled in the art is able to implement the case where the ramps RP and RN are compared to the potential Vout.

In the embodiments and variants previously disclosed, when the transistor 13 is switched to the off state while the current IL is negative, the potential V11 goes from the value GND (transistor 13 on) to the value Vbat+Vdiode (transistor 13 off). During the transition from the value GND to the value Vbat+Vdiode, the potential V11 assumes, or crosses, the value of the potential Vout, which can cause a switching of the signal sig to its first state, although in practice, the current IL is not at a stable null value. It may be desirable for this switching of the signal sig to the first state not to be taken into account, for example for it not to make it possible to restart a new operating cycle. Indeed, this could lead to starting a new operating cycle while the current IL does not have a stable null value, for example while the current IL is negative. Furthermore, a similar switching of the signal sig to its first state could occur when the transistor 13 is switched to the off state while the current IL is still positive.

According to one embodiment, the converter 4 is configured to filter, during a predetermined time delay duration from the switching of the transistor 13 to the off state, the switching operations of the signal sig to its first state. In other words, the converter 4 is configured to take account of the switching operations of the signal sig to its first state only after the end of the time delay duration. As an example, this time delay duration is in the order of 10 ns, for example equal to 10 ns.

According to one example, the circuit 17, for example its circuit 300, is configured to take account of the switching operations of the signal sig only after the time delay duration has elapsed.

According to another example, the converter 4 comprises an additional circuit, not shown in FIGS. 4 and 8, configured to generate a filtered signal based on the signal sig, the filtered signal corresponding to the signal sig with the difference that it does not have any switching during the time delay duration. In other words, the additional circuit is for example configured to supply the filtered signal that switches after each switching of the signal sig outside the time delay period, and to maintain the state of the filtered signal throughout the entire time delay duration. In still other words, the filtered signal switches from a first state to a second state upon each switching of the signal sig from its first state to its second state, and from its second state to its first state upon each switching of the signal sig from its second state to its first state, except during the time delay duration where the filtered signal is kept in its second state. The circuit 17 is then configured to condition the switching of the transistor 9 to the on state as a function of the state of the filtered signal. This filtered signal being obtained based on the signal sig, the circuit 17 is indeed configured to condition the switching of the transistor 9 to the on state based on the signal sig.

One skilled in the art is able to provide other embodiments making it possible to avoid taking account of a switching of the signal sig to the first state that is not representative of a current IL with a stable and null value, for example by implementing a filtering function of the switching operations of the signal sig during the time delay duration.

Furthermore, like in the embodiments and variants previously described, when the current IL in the inductance 15 is canceled out, the potential V11 of the node 11 can, in practice, have oscillations around the value of the potential Vout. As a result, the signal sig, or the filtered signal disclosed above, can also have oscillations, for example as long as the potential V11 does not have a stable value equal to that of the potential Vout.

According to one embodiment, the converter 4 is configured to store, after the time delay duration, a first switching to the first state of the signal sig or of the corresponding filtered signal.

According to one example, this storing is carried out by the circuit 300, for example directly by the finite state machine of the circuit 300.

According to another example, the converter 4 comprises an(other) additional circuit, not shown in FIGS. 4 and 8, configured to carry out this storing. This additional circuit is for example configured to supply an additional signal switching to a first state when the signal sig or the filtered signal switches to its first state after the time delay duration, then to maintain the first state of the additional signal during a predetermined duration, for example, at least until a control of the transistor 9 to the on state, or at least until a switching of the transistor 13 to the on state. As an example, the circuit 17, for example its circuit 300, receives this additional signal, and makes a switching of the transistor 9 (beginning of a new operating cycle) subject to the fact that this additional signal is in its first state. The additional signal being obtained based on the signal sig or the filtered signal in turn obtained based on the signal sig, the switching of the transistor 9 to the on state is indeed conditioned based on the signal sig, or in other words, by the signal sig.

One skilled in the art is able to provide other embodiments making it possible to account for any oscillations of the signal sig when the current IL is canceled out, for example other embodiments of a function for storing a first switching to the first state of the signal sig or of the filtered signal after the time delay duration.

According to one embodiment, the converter 4 comprises a circuit configured to implement a filtering function and a storing function as disclosed above. This circuit is then configured to: supply, based on the signal sig, a signal sig' switching between a first state and a second state, for example respectively low and high; keep the signal sig' in its second state during a predetermined time delay duration after a control of a switching of the transistor 13 to the off state; switch the signal sig' to its first state during the first switching of the signal sig to its first state taking place once the time delay duration has elapsed; and keep, during a predetermined duration, the signal sig' in its first state following a first switching of the signal sig' to its first state after the time delay duration, for example, while maintaining this first state of the signal sig' at least until the transistor 9, or even the transistor 13, is switched to the on state during the following operating cycle.

In such an embodiment, the circuit 17 is then configured to make a switching of the transistor 9 to the on state subject to the first state of the signal sig'. Because the signal sig' is obtained based on the signal sig, the switching of the transistor 9 to the on state is indeed conditioned based on the signal sig. Furthermore, in such an embodiment, it is possible to provide that the circuit 300 receives a signal START' resulting from a logic operation, for example an AND logic, between the signal sig' and the signal START, such that the signal START' is in a state, for example the high state, only if the voltage Vout is lower than the voltage Vref and if the signal sig' is in its first state, and in another state, for example the low state, otherwise. In this case, the circuit 300 starts a new operating cycle once the signal START' is in the state indicating that the voltage Vout is less than Vref and that the signal sig' is in its first state.

Figure 9:
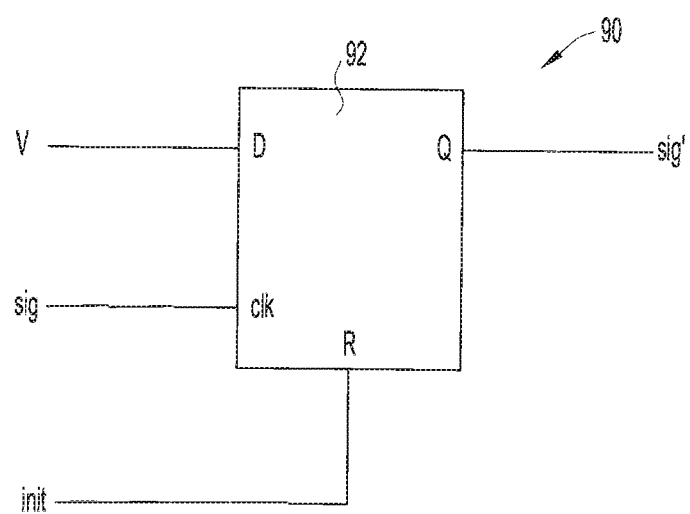
FIG. 9 shows an embodiment of the converter of FIGS. 4 and 8.

FIG. 9 shows an embodiment of a circuit 90 configured to generate a signal sig' as disclosed above.

The circuit 90 comprises a D flip-flop 92. The data input D of the flip-flop 92 is coupled, preferably connected, to a potential V corresponding to a first state of the signal sig'. The output Q of the flip-flop 92 supplies the signal sig'. The synchronization input clk of the flip-clop 92 is coupled, preferably connected, to the output 41 of the circuit 40 (FIGS. 4, 5, 6 and 8) so as to receive the signal sig. The flip-flop 92 further comprises an initialization input R configured to receive an initialization signal init. When the initialization signal is in an inactive state, for example the low state, the level of the input D is copied on the output Q upon each switching of the signal sig from its second state to its first state, and, when the signal init is in an active state, for example the high state, the output Q of the flip-flop 92 is forced to a level corresponding to the second state of the signal sig'.

As an example, the signal init is in the active state when the transistor 13 is in the on state and also as long as the time delay duration after a switching of the transistor 13 to the off state is not complete, and, for example, in the inactive state otherwise. Thus, when the transistor 13 is on, the signal init is active and the signal sig' is in its second state. Furthermore, when the transistor 9 is off but the time delay duration is not complete, the signal init is active and the signal sig' is kept in its second state. Once the time delay is complete, when the signal sig switches from its second state to its first state, the output Q of the flip-flop 92 switches to the potential V, as a result of which the signal sig' switches to its first state, the signal sig' being kept in its first state as long as the signal init stays inactive.

It will be understood based on the operation disclosed above that the signal init can be obtained based on the control signal of the transistor 13, this control signal being available on the output 177 of the circuit 17 (FIGS. 4 and 8). For example, the signal init corresponds to the control signal of the transistor 13 to which a delay is applied equal to the time delay duration.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove. In particular, one skilled in the art is able to design the circuit(s) implementing the filtering function applied to the signal sig to account for any first switching of the signal sig to its first state while the current IL in the inductance does not have a null and stable value, and the filtering function to account for any oscillations of the signal sig when the current IL is cancelled out.

What is claimed is:

1. A voltage converter comprising:
    a first transistor coupled between an internal node of the voltage converter and a first node configured to receive a supply voltage;
    a second transistor coupled between the internal node and a second node configured to receive a reference voltage;
    an inductance coupled between the internal node and an output node of the voltage converter;
    a first circuit configured to control the first and second transistors; and
    a second circuit configured to detect, when the first and second transistors are off, when an internal node voltage of the internal node is equal to an output voltage of the output node, wherein the first circuit is configured to turn on the first transistor when the second circuit detects that the internal node voltage is equal to the output voltage.

2. The voltage converter of claim 1, wherein the second circuit is configured to supply a first signal, wherein the first signal is configured to:
switch from a first state of the first signal to a second state of the first signal when the first and second transistors are off and the internal node voltage is greater than the supply voltage or less than the reference voltage; and
switch from the second state of the first signal to the first state of the first signal when the first and second transistors are off and the internal node voltage is equal to the output voltage.

3. The voltage converter of claim 2, wherein the first circuit is configured to turn on the first transistor based on the first signal.

4. The voltage converter of claim 2, wherein the second circuit comprises a third transistor and a fourth transistor coupled in series between the first and second nodes, the second circuit being configured so that the internal node voltage determines an off or on state of each of the third and fourth transistors.

5. The voltage converter of claim 4, wherein the second circuit is further configured so that the third and fourth transistors are in the same on or off state when the internal node voltage is equal to the output voltage.

6. The voltage converter of claim 4, wherein the third and fourth transistors are metal-oxide-semiconductor (MOS) transistors, and wherein the first signal is determined based on drain voltages of the third and fourth transistors.

7. The voltage converter of claim 4, wherein the second circuit comprises a combinatory circuit having a first input coupled to a first current path terminal of the third transistor, a second input coupled to a first current path terminal of the fourth transistor, and an output configured to supply the first signal.

8. The voltage converter of claim 7, wherein the combinatory circuit comprises an AND gate having a first input coupled to the first current path terminal of the third transistor, a second input coupled to the first current path terminal of the fourth transistor via an inverter gate, and an output coupled to the output of the combinatory circuit.

9. The voltage converter of claim 4, wherein the third and fourth transistors are metal-oxide-semiconductor (MOS) transistors, and wherein source terminals of the third and fourth transistors are configured to receive the internal node voltage.

10. The voltage converter of claim 9, wherein gate terminals of the third and fourth transistors are configured to receive the output voltage, wherein a drain terminal of the third transistor is coupled to the first node, and wherein a drain of the fourth transistor is coupled to the second node.

11. The voltage converter of claim 10, wherein the first and fourth transistors are p-type transistors, and wherein the second and third transistors are n-type transistors.

12. The voltage converter of claim 4, wherein control terminals of the third and fourth transistors are configured to receive the internal node voltage.

13. The voltage converter of claim 12, wherein a first current path terminal of the third transistor is coupled to the first node, a first current path terminal of the fourth transistor is coupled to the second node, and a second current path terminal of the third transistor is coupled to a second current path terminal of the fourth transistor via a resistance.

14. The voltage converter of claim 13, wherein the first and third transistors are p-type transistors, and wherein the second and fourth transistors are n-type transistors.

15. The voltage converter of claim 14, wherein the first, second, third, and fourth transistors are metal-oxide-semiconductor (MOS) transistors.

16. The voltage converter of claim 2, further comprising a third circuit configured to supply, based on the first signal, a second signal configured to switch between a first state of the second signal and a second state of the second signal, wherein the third circuit is configured to:
keep the second signal in the second state of the second signal during a first predetermined duration after the second transistor is turned off;
switch, after the first duration, the second signal to the first state of the second signal after the first signal switches to the first state of the first signal; and
keep the second signal in the first state of the second signal during a second predetermined duration after the second signal switches to the first state of the second signal.

17. A method of operating a voltage converter, the method comprising:
receiving a supply voltage at a first rail;
receiving a reference voltage at a second rail;
delivering a regulated output voltage at an output node by controlling first and second transistors, wherein the first transistor is coupled between the first rail and an internal node, wherein the second transistor is coupled between the internal node and the second rail, and wherein the internal node coupled to the output node via an inductance;
detecting, when the first and second transistors are off, when an internal node voltage of the internal node is equal to the regulated output voltage; and
turning on the first transistor when detecting that the internal node voltage is equal to the regulated output voltage when the first and second transistors are off.

18. The method of claim 17, wherein controlling the first and second transistors comprises, at each operating cycle of the voltage converter, successively:
setting to the on state the first transistor;
setting to the off state the first transistor and to the on state the second transistor; and
setting to the off state the second transistor.

19. An electronic circuit comprising:
a first circuit having a first output configured to be coupled to a control terminal of a first transistor, and a second output configured to be coupled to a control terminal of a second transistor, and a first input configured to be coupled to the first and second transistors via an inductance; and
a second circuit having a first input configured to be coupled to the first input of the first circuit via the inductance, a second input coupled to the first input of the first circuit, and an output coupled to a second input of the first circuit, the second circuit configured to assert an output signal at the output of the second circuit when the first and second transistors are off and a first voltage at the first input of the second circuit is equal to a second voltage at the second input of the second circuit, and wherein the first circuit is configured to turn on the first transistor when the output signal of the second circuit is asserted.

20. The electronic circuit of claim 19, wherein the second circuit comprises:

a third transistor having a current path coupled between a first node configured to receive a supply voltage and a second node configured to receive a reference voltage; and a fourth transistor having a current path coupled between the current path of the first transistor and the second node, wherein a first internal node coupled between the current paths of the third and fourth transistors is coupled to the first input of the second circuit, and wherein control terminals of the third and fourth transistors are coupled to the second input of the second circuit.

21. The electronic circuit of claim 20, wherein the second circuit further comprises a first resistor coupled between the current path of the third transistor and the first node, and a second resistor coupled between the current path of the fourth transistor and the second node.

22. The electronic circuit of claim 20, wherein the second circuit further comprises a logic circuit having a first input coupled to a second internal node that is coupled between the current path of the third transistor and the first node, a second input coupled to a third internal node that is coupled between the current path of the fourth transistor and the second node, and an output coupled to the output of the second circuit.

23. The electronic circuit of claim 19, wherein the first circuit comprises:

a first comparator having an input coupled to the first input of the first circuit; and a finite state machine having a first output coupled to the first output of the first circuit, a second output coupled to the second output of the first circuit, a first input coupled to an output of the first comparator, and a second input coupled to the second input of the first circuit.

\* \* \* \* \*